United States Patent [19]

Kim

[11] Patent Number: 5,007,607

[45] Date of Patent: Apr. 16, 1991

[54] SUPPORT UNIT FOR HOME APPLIANCES

[75] Inventor: Tae Y. Kim, Suwon, Japan

[73] Assignee: SamSung Electronics Co., Ltd., Suwon, Rep. of Korea

[21] Appl. No.: 400,876

[22] Filed: Aug. 30, 1989

[30] Foreign Application Priority Data

Dec. 30, 1988 [KR] Rep. of Korea .................. 88-22121

[51] Int. Cl.$^5$ .......................................... F16M 11/00
[52] U.S. Cl. .................................. 248/188.9; 248/615
[58] Field of Search ................. 248/188.9, 615, 677; 135/77, 86

[56] References Cited

U.S. PATENT DOCUMENTS

| | | | |
|---|---|---|---|
| 1,055,111 | 3/1913 | Wilcox | 135/86 X |
| 1,340,617 | 5/1920 | Lynde | 135/86 X |
| 2,221,238 | 11/1940 | Johnson | 248/205.5 |
| 2,458,621 | 1/1949 | Miller | 248/188.9 X |
| 2,806,314 | 9/1957 | Moran | 248/205.5 X |
| 2,944,367 | 7/1960 | Bontecue | 248/615 X |
| 3,025,557 | 3/1962 | Knowlton | 248/615 X |
| 4,718,631 | 1/1988 | Reynolds et al. | 248/677 X |

FOREIGN PATENT DOCUMENTS

| | | | |
|---|---|---|---|
| 726469 | 1/1966 | Canada | 135/86 |
| 1121675 | 1/1962 | Fed. Rep. of Germany | 248/615 |

Primary Examiner—Alvin C. Chin-Shue
Attorney, Agent, or Firm—Robert E. Bushnell

[57] ABSTRACT

A support unit for home appliance including a supporting body inclusive of a rib, a fixing neck inclusive of a fixing hole and an inserting protrusion inclusive of orifice. Differences of thickness for the supporting body and a curved face cause the support unit to control vertically, the fixing hole supplies elasticity in case that the home appliance is a heavy weight. The orifice also supplies elasticity in case of inserting into a connecting space of a base plate.

32 Claims, 3 Drawing Sheets

SUPPORT UNIT FOR HOME APPLIANCES

BACKGROUND OF THE INVENTION

1. Field of the invention

The present invention relates to a support unit for supporting home appliances. More particularly, it relates to a support unit which is formed with a supporting body, fixing neck and inserting protrusion formed as a single body. The support unit is designed to maintain a strong fixing. The unit supplies keeping horizontal regardless of settled plane and that the unit is manufactured only a simple manufacturing process.

2. Related Art

Most conventional support units are fixed at base plates of home appliances such as a microwave oven for example. Such support units are formed mainly with a main body and fixing means as is illustrated in FIGS. 4A, 4B and 4C.

Referring to FIG. 4A, a vertical orifice is formed vertically in main body 41 and a screw 40 is inserted into base plate (not shown) through the vertical orifice.

Referring to FIG. 4B, a vertical orifice (not shown) is formed vertically in main body 42 and split protrusion 42a is formed on a top portion of the vertical orifice.

A pin 43 is inserted into the base plate (not shown) through the vertical orifice and the split protrusion 42a.

The split protrusion 42a is burst open by inserting the pin 43 and so the main body 42 is fixed at the base plate by the split protrusion 42a. As in FIGS. 4A and 4B, main bodies 41 and 42 are separated easily from the base plate owing to an impact or frequent moving of home appliances.

In assembling, a screw or pin respectively, is needed.

An improved type is as shown in FIG. 4C.

Referring to FIG. 4C, inserting protrusion 44b is formed on main body 44 in a single body and curved elastic protrusion 44a is formed between inserting protrusion 44b and main body 44. Inserting protrusion 44b is fixed into a fixing hole of the base plate by a push fit and so, the main body 44 inclusive of inserting protrusion 44b can't be easily separated from the base plate. An elastic protrusion 44a formed in the shape of a curved plate, supplies elasticity to the base plate and it can prevent home appliances from moving.

In case it is used for a long time and that the product is a heavy weight, the elasticity of elastic protrusion 44a is not maintained if the main body 44 is separated from the base plate. Also the unit is not suitable in case that it is settled on an uneven plane.

SUMMARY OF THE INVENTION

The object of the present invention is to maintain a strong grip and enable expansion and contraction regardless of a home appliance's weight.

Another object of the present invention is to keep the appliance horizontal regardless of the plane upon which it rests.

BRIEF DESCRIPTION OF THE DRAWINGS

The foregoing and other objects, features and advantages of the present invention should become apparent from the following description taken in conjunction with the accompanying drawings, in which.

DETAILED DESCRIPTION OF THE PREFERRED EMBODIMENT

Figure 1:
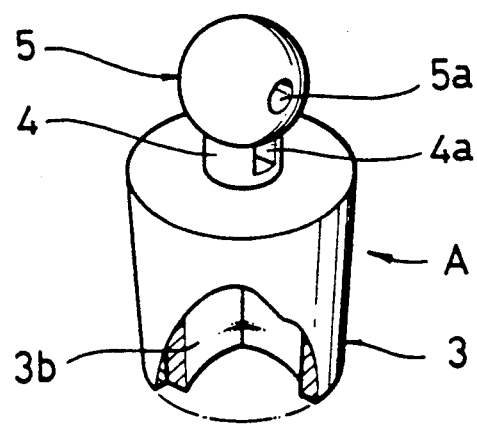
FIG. 1 is a partially cutaway view in perspective of a preferred embodiment of the invention.
Figure 2:
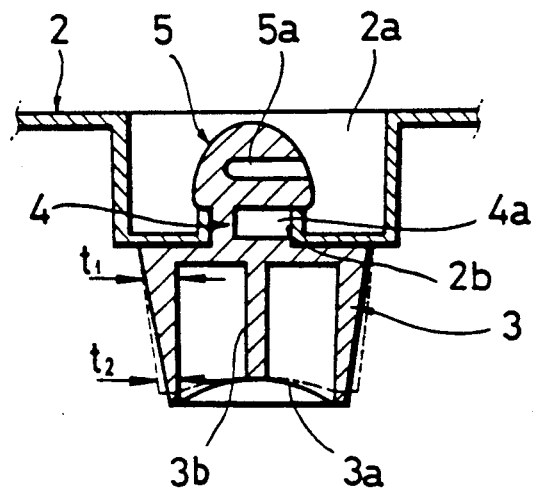
FIG. 2 is a vertical sectional view of the present invention.
Figure 3:
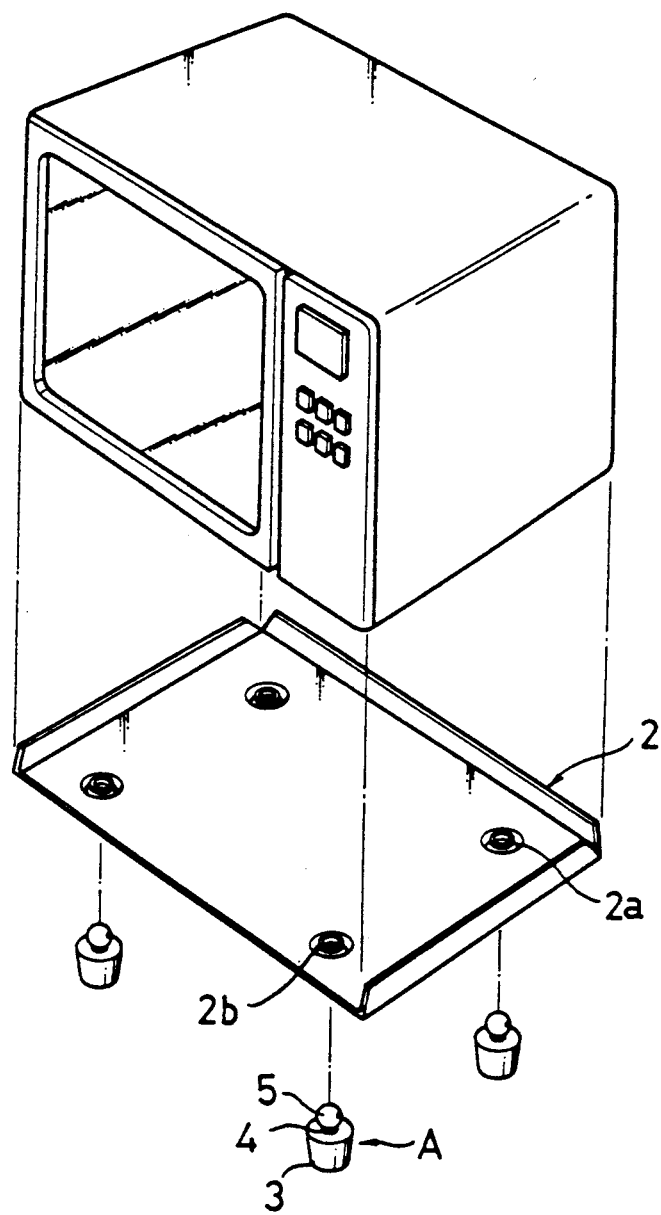
FIG. 3 is an exploded view of a microwave oven according to the present invention.
Figure 4A:
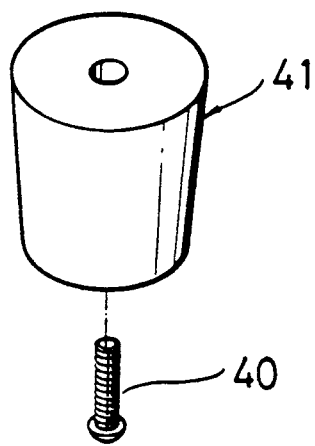
FIG. 4A and 4B are exploded views of prior units.
Figure 4B:
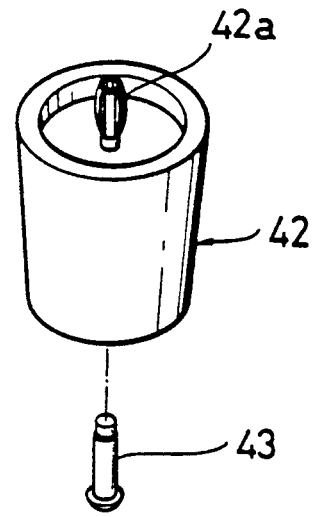
Figure 4C:
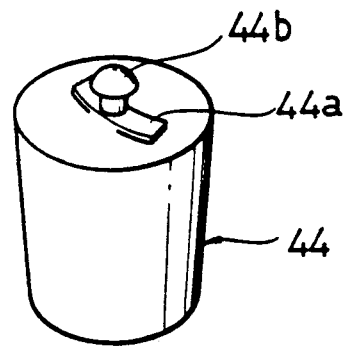
FIG. 4C is a perspective view of a prior unit.

Referring to FIGS. 1 and 2, FIG. 1 is a partially cutaway view of the present invention and FIG. 2 is a vertical sectional view of the present invention as a fixed state in a connecting space of a base plate. A support unit A of present invention includes supporting body 3, fixing neck 4 and inserting protrusion 5 in a single body. Supporting body 3 has a cross type rib 3b, which has a curvilinear face 3a at the bottom of rib 3b, in an inner space of the supporting body 3. Neck 4 is formed on the upper part of supporting body 3 and neck 4 has a fixing hole 4a which is formed horizontally. Protrusion 5 is formed on the upper part of fixing neck 4 and the inserting protrusion 5 to have an orifice 5a which is formed horizontally in one face. The support unit A is manufactured with an elastic material. General base plate 2 of a microwave oven has connecting spaces 2a for inserting protrusion 5. Receiving spaces 2a have mounting holes 2b respectively in their bottoms. Thickness ($t_2$) of the lower surface of supporting body 3 is thinner than thickness ($t_2$) of its upper surface of it.

In operating, the inserting protrusion 5 is inserted into receiving space 2a by push fit. Though the diameter of inserting protrusion 5 is greater than that of mounting hole 2b, the inserting protrusion 5 can be inserted into the receiving space 2a owing to the presence of orifice 5a which supplies elasticity. And then, the fixing neck 4 forms a just fit owing to the elasticity provided by fixing hole 4a and so the base plate 2 is held between inserting protrusion 5 and supporting body 3. If a home appliance is a heavy weight, the rib 3b prevents the supporting body 3 from moving horizontally. As the bottom of the rib 3b is formed with curved face 3a and the thickness ($t_2$) is thinner than the thickness ($t_1$), the supporting body 3 is changed vertically from full line to dotted line according to application of the weight of appliance as in FIG. 2. If a settled plane has a few degrees of slant, the supporting body 3 can maintain the base plate horizontal with the aid of mutual operation of the face 3a and the difference of the thicknesses ($t_1$, $t_2$). In case that the slant is greater than usual, the supporting body 3 also maintains horizontal With the aid of the elasticity due to hole 4a. Hole 4a supplies the elasticity to neck 4 because the neck 4 is inserted into hole 4a with a push fit.

Consequently, the present invention supplies a support unit in a body with elastic material, consequently it reduces manufacturing costs through its body, simplification of assembly process and a strong and secure retention regardless of a home appliance's weight. Present invention is adapted for small electric home appliances.

While preferred embodiments have been set forth, various modifications, alterations, and changes may be made without departing from the spirit and scope of the present invention, as defined in the appended claims.

What is claimed is;

1. A support unit of home appliances, comprising:
    a supporting body on which a base plate of home appliances is fixed said supporting body having a longitudinal axis and exterior sidewalls forming an inner space, said supporting body including:
- a rib formed in said inner space and extending completely radially across from oppositely disposed portions of said sidewalls of said supporting body;
- a curved face formed at a bottom of the rib for adding elasticity;
- a surface thickness of said supporting body whereby the thickness of a lower surfaces thinner than that of an upper surface;
- a neck having a fixing hole thereinto extending radially and substantially perpendicularly to said longitudinal axis, said fixing hole opening to the exterior of the neck, formed on the supporting body; and
- an inserting protrusion having an orifice thereinto extending radially and substantially perpendicularly to said longitudinal axis, said orifice opening to the exterior of the neck.

2. The support unit of claim 1, wherein said fixing hole comprises a slot, with said slot opening through one side of said neck.

3. The support unit of claim 1, wherein said orifice comprises a passage extending radially across a longitudinal axis of said supporting body, with said passage opening through one surface of said protrusion.

4. The support unit of claim 2, wherein said orifice comprises a passage extending radially across said longitudinal axis of said supporting body, with said passage opening through one surface of said protrusion.

5. The support unit of claim 4, further comprised of said slot and orifice each having radial axis lying within a common plane.

6. The support unit of claim 1, wherein said neck and protrusion have parallel diameters extending across said longitudinal axis of said supporting body, with said protrusion having a diameter greater than said neck.

7. The support unit of claim 2, wherein said neck and protrusion have parallel diameters extending across said longitudinal axis, with said protrusion having a diameter greater than said neck.

8. The support unit of claim 3, wherein said neck and protrusion have parallel diameters extending across said longitudinal axis, with said protrusion having a diameter greater than said neck.

9. The support unit of claim 4, wherein said neck and protrusion have parallel diameters extending across said longitudinal axis, with said protrusion having a diameter greater than said neck.

10. The support unit of claim 1, wherein:
- said supporting body is comprised of a cylindrical body open at said bottom, surrounding said inner space, and an upper base disposed axially opposite said bottom and covering said inner space to provide a union between said cylindrical body and said neck, said cylindrical body having an inner surface within said inner space; and
- said rib being integral with and extending between said upper base and said inner surface.

11. The support unit of claim 1, wherein said rib is symmetrically positioned within said inner space and divides said inner space into a plurality of segments.

12. The support unit of claim 1, wherein said rib is symmetrically positioned within said inner space, has a plurality of radially extending surfaces joined along a longitudinal axis of said supporting body and divides said inner space into a plurality of segments of substantially equal volume.

13. The support unit of claim 10, wherein said rib is symmetrically positioned within said inner space and divides said inner space into a plurality of segments.

14. The support unit of claim 10, wherein said rib is symmetrically positioned within said inner space, has a plurality of radially extending surfaces joined along said longitudinal axis and divides said inner space into a plurality of segments of substantially equal volume.

15. The support unit of claim 2, wherein:
- said supporting body is comprised of a cylindrical body open at said bottom, surrounding said inner space, and upper base disposed axially opposite said bottom and covering said inner space to provide a union between said cylindrical body and said neck, and said cylindrical body having an interior surface within said inner space; and
- said rib being integral with and extending between said upper base and said inner surface.

16. The support unit of claim 2, wherein said rib is symmetrically positioned within said inner space, has a plurality of radially extending surfaces joined along said longitudinal axis and divides said inner space into a plurality of segments.

17. A support unit for use in supporting an appliance having a base plate perforated by an aperture, said support unit comprising:
- a monolithic supporting body formed along a longitudinal axis, with an upper part, and a lower part having exterior sidewalls forming an hollow interior with a wall thickness greater at an upper portion of said lower part than at an adjacent lower portio of said lower part;
- said lower part including a rib structure formed in the hollow interior and extending completely radially across from oppositely disposed portions of said sidewalls, providing a strengthening supporting force, and having a bottom periphery forming, in conjunction with a lower surface of the supporting body, concave lower surface;
- said upper part including an inserting protrusion having a diameter larger than the aperture in the base plate and a first hole which aids contraction in passing through the aperture, said first hole extending radially and substantially perpendicularly to said longitudinal axis and opening to the exterior of said inserting protrusion;
- a connecting member having a second hole which adds contraction during insertion of said protrusion and connecting member into the aperture, said second hole extending radially and substantially perpendicularly to said longitudinal axis and opening to the exterior of said connecting member, said connecting member connecting the supporting body and the inserting protrusion in an integrally formed body.

18. The support endow of claim 17, wherein sid first hole comprises a slot opening through one side of said connecting member.

19. The support unit of claim 17, wherein said second hole comprises a passage opening through one surface of said protrusion.

20. The support endow of claim 18, wherein said second hole comprises a passage extending radially across said longitudinal axis, said passage opening through one surface of said protrusion.

21. The support endow of claim 20, further comprised of said slot and passage each having radial axis lying within a common plane.

22. The support unit of claim 17, wherein said connecting member and protrusion have parallel diameters extending across said longitudinal axis of said supporting body, with said protrusion having a diameter greater than said connecting member.

23. The support unit of claim 18, wherein said connecting member and protrusion have parallel diameters extending across said longitudinal axis of said supporting body, with said protrusion having a diameter greater than said connecting member.

24. The support unit of claim 17, wherein:

said supporting body is comprised of a cylindrical body open at said bottom surface, supporting said hollow interior, an upper base disposed axially opposite said bottom surface and covering said hollow interior to provide a union between said cylindrical body and said connecting member, said cylindrical body having an inner surface within said hollow interior; and said rib structure being integral with and extending between said upper base and extending between said upper base and said inner surface.

25. The support unit of claim 17, wherein said rib structure is symmetrically positioned within said hollow interior and divides said hollow interior into a plurality of segments.

26. The support unit of claim 17, wherein said rib structure is symmetrically positioned within said hollow interior, has a plurality of radially extending surfaces joined along said longitudinal axis of said supporting body and divides said hollow interior into a plurality of segments of substantially equal volume.

27. A plug, comprising:

means for supporting a mass perforated by an aperture, said supporting means having a longitudinal axis and including a cylindrical body exterior sidewalls defining a hollow interior closed at a first end by a base having a first diameter greater than the aperture, said interior hollow being open at a second end axially opposite from said base, a wall thickness tapering from a greatest thickness at said base to a least thickness at said second end, and a rib structure disposed within and having a plurality of surfaces extending completely radially across said interior from oppositely disposed portions and said sidewalls said surfaces having ends forming a concave face bounded by said wall thickness of said second end;

connecting means exhibiting a second diameter less than said first diameter, disposed upon said base said connecting means having a slot extending radially and substantially perpendicularly to said longitudinal axis, and opening to the exterior of said connecting means; and compressible means connected to said supporting means via said connecting means, and made of a resilient material exhibiting an uncompressed cross-sectional dimension in a direction perpendicular to a longitudinal axis of said cylindrical body, said cross-sectional dimension being greater than said aperture, for reducing said cross-sectional dimension when said compressible mens is forced into the aperture, said compressible means having a passage extending radially and substantially perpendicularly to said longitudinal axis and opening to the exterior of said compressible means.

28. The plug of claim 27, further comprised of said surfaces being symmetrically positioned within said interior and dividing said interior into a plurality of segments.

29. The plug of claim 27, further comprised of said surfaces being symmetrically positioned within said interior and joined along said longitudinal axis, and dividing said interior into a plurality of segments of substantially equal volume.

30. The plug of claim 27, wherein said slot one side of said connecting means.

31. The plug of claim 27, wherein said passage opening through one surface of said compressible means.

32. The plug of claim 29, further comprising:

said slot opening through one side of said connecting means; and said passage opening through one surface of said compressible means.

* * * * *

UNITED STATES PATENT AND TRADEMARK OFFICE
CERTIFICATE OF CORRECTION

PATENT NO. : 5,007,607

DATED : 16 April 1991

INVENTOR(S) : Tae Y. KIM

It is certified that error appears in the above-identified patent and that said Letters Patent is hereby corrected as shown below:

<u>Column 4</u>

Claim 17, line 9, change "portio" to --portion--; and

Claim 18, line 1, change "sid" to --said--.

Signed and Sealed this

Eighteenth Day of August, 1992

*Attest:*

DOUGLAS B. COMER

*Attesting Officer*     Acting Commissioner of Patents and Trademarks

UNITED STATES PATENT AND TRADEMARK OFFICE
CERTIFICATE OF CORRECTION

PATENT NO. : 5,007,607
DATED : 16 April 1991
INVENTOR(S) : Tae Yoon Kim

It is certified that error appears in the above-indentified patent and that said Letters Patent is hereby corrected as shown below:

On the Title Page, item 75 replace "Tae Y. Kim, Suwon, Japan" with

--Tae Yoon Kim, Suwon, Rep. of Korea--.

Signed and Sealed this

Twenty-third Day of August, 1994

Attest:

BRUCE LEHMAN

*Attesting Officer*         *Commissioner of Patents and Trademarks*